United States Patent
Pan et al.

(10) Patent No.: US 9,697,912 B2
(45) Date of Patent: *Jul. 4, 2017

(54) LEAKAGE CURRENT DETECTION

(71) Applicant: MICRON TECHNOLOGY, INC., Boise, ID (US)

(72) Inventors: Feng Pan, Fremont, CA (US); Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/164,956

(22) Filed: May 26, 2016

(65) Prior Publication Data
US 2016/0351274 A1 Dec. 1, 2016

Related U.S. Application Data

(60) Provisional application No. 62/166,313, filed on May 26, 2015.

(51) Int. Cl.
*G11C 5/06* (2006.01)
*G11C 29/50* (2006.01)
*G11C 29/02* (2006.01)
*G11C 16/06* (2006.01)

(52) U.S. Cl.
CPC ............ *G11C 29/50* (2013.01); *G11C 29/025* (2013.01); *G11C 16/06* (2013.01); *G11C 2029/5006* (2013.01)

(58) Field of Classification Search
CPC ........ G11C 5/063; G11C 7/18; G11C 11/4097
USPC ..................... 365/63, 201, 185.17
See application file for complete search history.

(56) References Cited

U.S. PATENT DOCUMENTS

| | | | |
|---|---|---|---|
| 8,514,630 B2 | 8/2013 | Huynh et al. | |
| 8,519,879 B1* | 8/2013 | Denham | H03M 1/60 324/116 |
| 8,588,107 B2 | 11/2013 | Yamada | |
| 8,634,264 B2 | 1/2014 | Yamada | |
| 9,281,078 B2 | 3/2016 | Kessenich et al. | |
| 9,443,610 B1* | 9/2016 | Pan | G11C 29/025 |
| 2009/0273386 A1* | 11/2009 | Korobeynikov | G06G 7/186 327/337 |
| 2011/0074612 A1* | 3/2011 | Ariyoshi | H03M 1/1076 341/122 |
| 2012/0250203 A1* | 10/2012 | Makihara | G01R 31/362 361/86 |
| 2013/0285705 A1* | 10/2013 | Kabir | G11C 27/02 327/94 |

* cited by examiner

*Primary Examiner* — Connie Yoha
(74) *Attorney, Agent, or Firm* — Dicke, Billig & Czaja, PLLC

(57) ABSTRACT

A first switch is closed to initialize a circuit by charging a capacitance of the circuit. A second switch is closed to initialize an amplifier in unity-gain configuration. The amplifier is capacitively coupled to the circuit. The first switch and the second switch are then opened to detect a leakage current of the circuit by detecting a change in an output voltage of the amplifier.

26 Claims, 14 Drawing Sheets

LEAKAGE CURRENT DETECTION

RELATED APPLICATIONS

This application claims the benefit of U.S. Provisional Application No. 62/166,313, filed on May 26, 2015, hereby incorporated herein in its entirety by reference.

TECHNICAL FIELD

The present disclosure relates generally to leakage current detection, in particular, in one or more embodiments, the present disclosure relates to leakage current detection in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Detecting the leakage current of different circuitry, such as select lines and word lines, of a memory device may be used to detect defects within the memory device. The defects that may be detected include, for example, word line to word line shorting or word line to substrate shorting. The leakage current of the different circuitry of the memory device may be detected using a probe test at the wafer level using leakage current detection circuitry built into each die of the wafer. The leakage current detection circuitry should use a minimum of die area and accurately detect leakage currents.

For the reasons stated above, and for other reasons stated below which will become apparent to those skilled in the art upon reading and understanding the present specification, there is a need in the art for alternative methods for leakage current detection, and apparatus or system to perform such methods.

DETAILED DESCRIPTION

Figure 1:
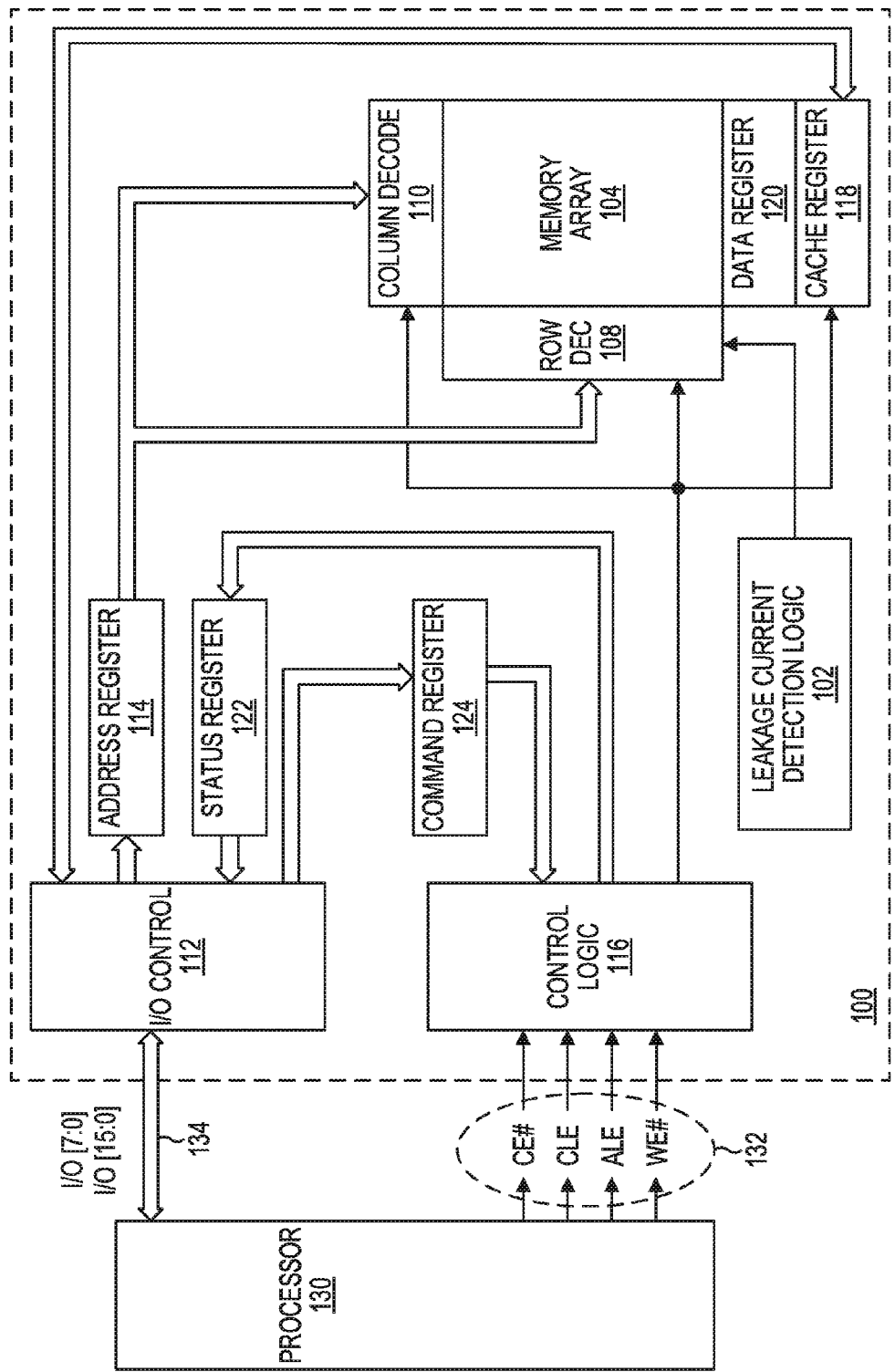
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense. Any parasitic resistances of components illustrated and described herein may be deemed negligible.

Leakage current detection is used during wafer level probe tests to detect defects within a memory device. The circuitry used to detect the leakage current is built into each die of the wafer. Accordingly, this disclosure describes embodiments for achieving high accuracy and high speed in the detection of leakage current while using less die area.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes leakage current detection logic 102. Leakage current detection logic 102 may include a controller and other circuitry for detecting the leakage current of various circuitry of memory device 100. In one example, leakage current detection logic 102 sequentially detects the leakage current of each select line and word line of memory array 104 to detect defects within the memory array. Leakage current detection logic 102 provides leakage current detection at high speed and high accuracy while utilizing a small area of the die of memory device 100. While leakage current detection logic 102 is illustrated within memory device 100, in other examples leakage current detection logic 102 or portions thereof may be part of a testing device external to memory device 100.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
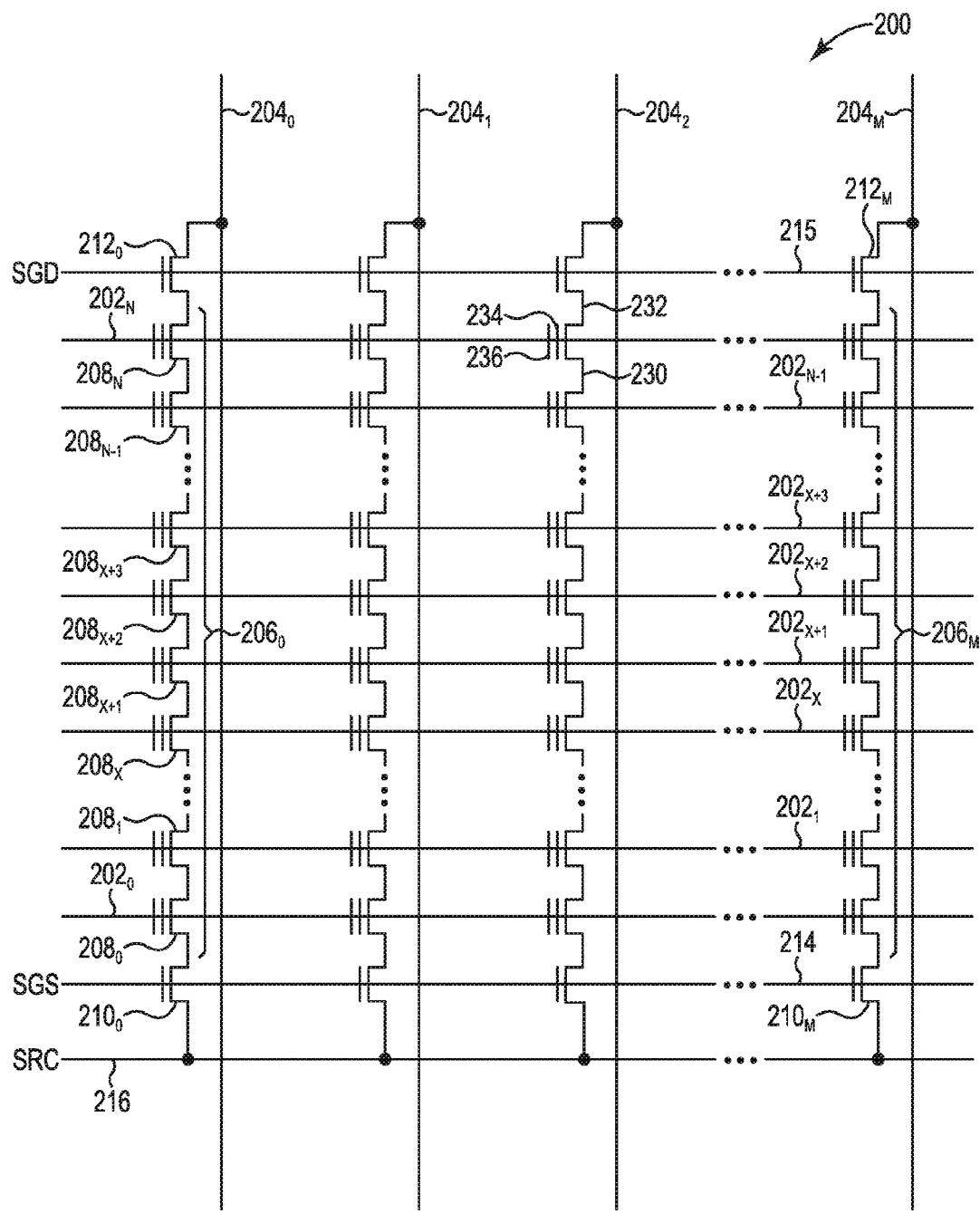
FIG. 2 is a schematic of a portion of an array of memory cells as could be used in a memory device of the type described with reference to FIG. 1.

FIG. 2 is a schematic of a NAND memory array 200, e.g., as a portion of array of memory cells 104. Memory array 200 includes access lines, such as word lines $202_0$ to $202_N$, and data lines, such as bit lines $204_0$ to $204_M$. The word lines 202 may be coupled to global access lines (e.g., global word lines), not shown in FIG. 2, in a many-to-one relationship. For some embodiments, memory array 200 may be formed over a semiconductor that, for example, may be conductively doped to have a conductivity type, such as a p-type conductivity, e.g., to form a p-well, or an n-type conductivity, e.g., to form an n-well.

Memory array 200 might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2 might be a quasi-two-dimensional memory array and might have a generally planar structure, e.g., where the common source 216, strings 206 and bit lines 204 extend in substantially parallel planes. Alternatively, the memory array in FIG. 2 might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Although the example of FIG. 2 is discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
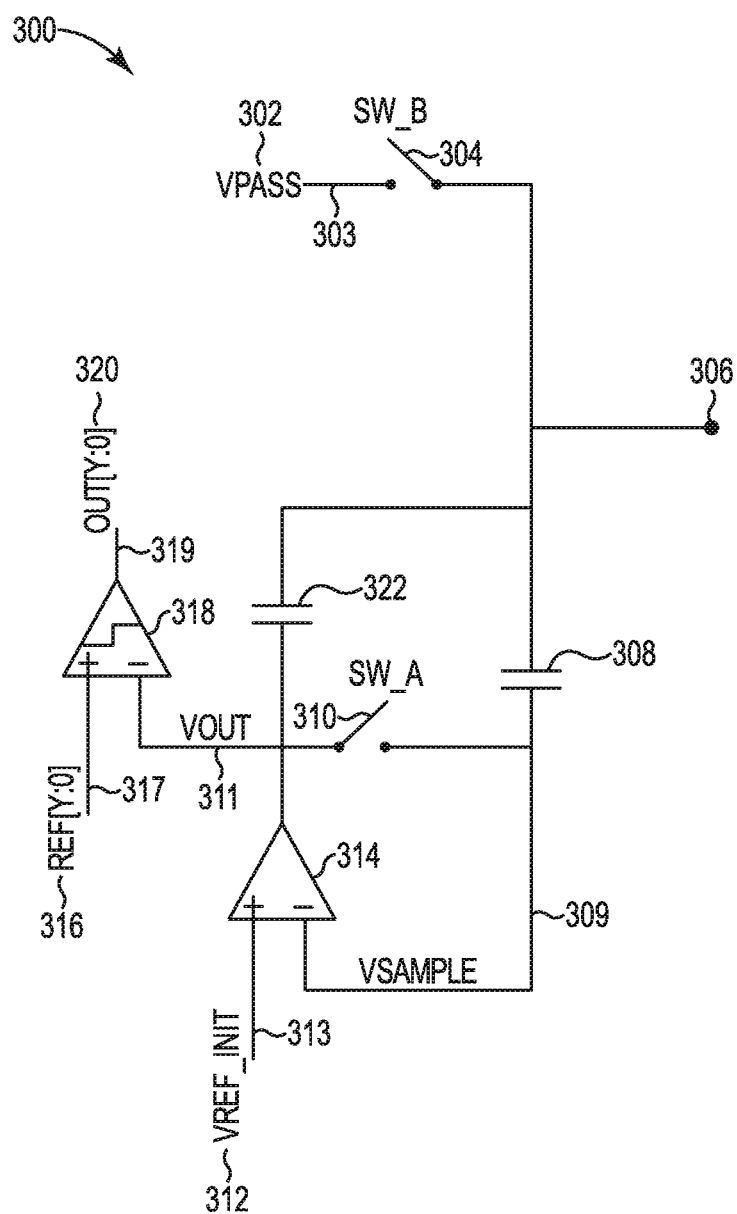
FIG. 3 is a schematic diagram illustrating one embodiment of a leakage current detection circuit.

FIG. 3 is a schematic diagram illustrating one embodiment of a leakage current detection circuit 300. Leakage current detection circuit 300 includes a first switch (SW_B) 304, a second switch (SW_A) 310, a first capacitor 322 (e.g., 1 pF), a second capacitor 308 (e.g., 1 pF), an amplifier 314 (e.g., an operational amplifier), and an analog-to-digital converter (ADC) 318 including a plurality of comparators. One side of switch 304 is electrically coupled to a first reference voltage (VPASS) 302 (e.g., 15V) through a node 303, and the other side of switch 304 is electrically coupled to node 306. Node 306 is electrically coupled to one side of capacitor 308 and one side of capacitor 322. The other side of capacitor 308 is electrically coupled to one side of switch 310 and the inverting input of amplifier 314 through a sample voltage (VSAMPLE) signal path 309. The other side of capacitor 322 is electrically coupled to the other side of switch 310, the inverting input of each comparator of ADC 318, and the output of amplifier 314 through a voltage output (VOUT) signal path 311. The non-inverting input of amplifier 314 is electrically coupled to a second reference voltage (VREF_INIT) 312 (e.g., 1V) through a signal path 313.

The non-inverting input of each comparator of ADC 318 is electrically coupled to a reference voltage (REF[Y:0]) 316 (e.g., 0.9V to 1.1V with 0.01V step) through signal paths 317, respectively. The output of each comparator of ADC 318 provides an output voltage (OUT[Y:0]) 320 through signal paths 319, respectively. ADC 318 converts VOUT to a digital value. The number of comparators "Y" of ADC 318 is selected based on a desired resolution of the ADC.

With switch 304 closed (i.e., conducting), reference voltage 302 is connected to node 306 to initialize the voltage on node 306 to VPASS. In one example, a capacitance of a circuit electrically coupled to node 306 is charged in response to switch 304 being closed. With switch 310 closed (i.e., conducting), amplifier 314 is set in unity-gain configuration such that VSAMPLE and VOUT substantially equal VREF_INIT. With switches 304 and 310 open (i.e., not conducting), the leakage current of a circuit electrically coupled to node 306 may be detected by sensing a change in VOUT. In one example, in response to a circuit electrically coupled to node 306 having a leakage current, the voltage at node 306 will decrease, which in turn will cause VSAMPLE to decrease proportionally. The decrease in VSAMPLE will in turn cause amplifier 314 to increase VOUT to compensate for the decrease in VSAMPLE. The change in VOUT is detected by ADC 318, which converts VOUT to a digital value that may be sampled by a controller or other suitable logic circuitry (not shown) within the memory device or within a testing device external to the memory device. The change in VOUT is linearly proportional to the leakage current of the circuit electrically coupled to node 306.

Figure 4:
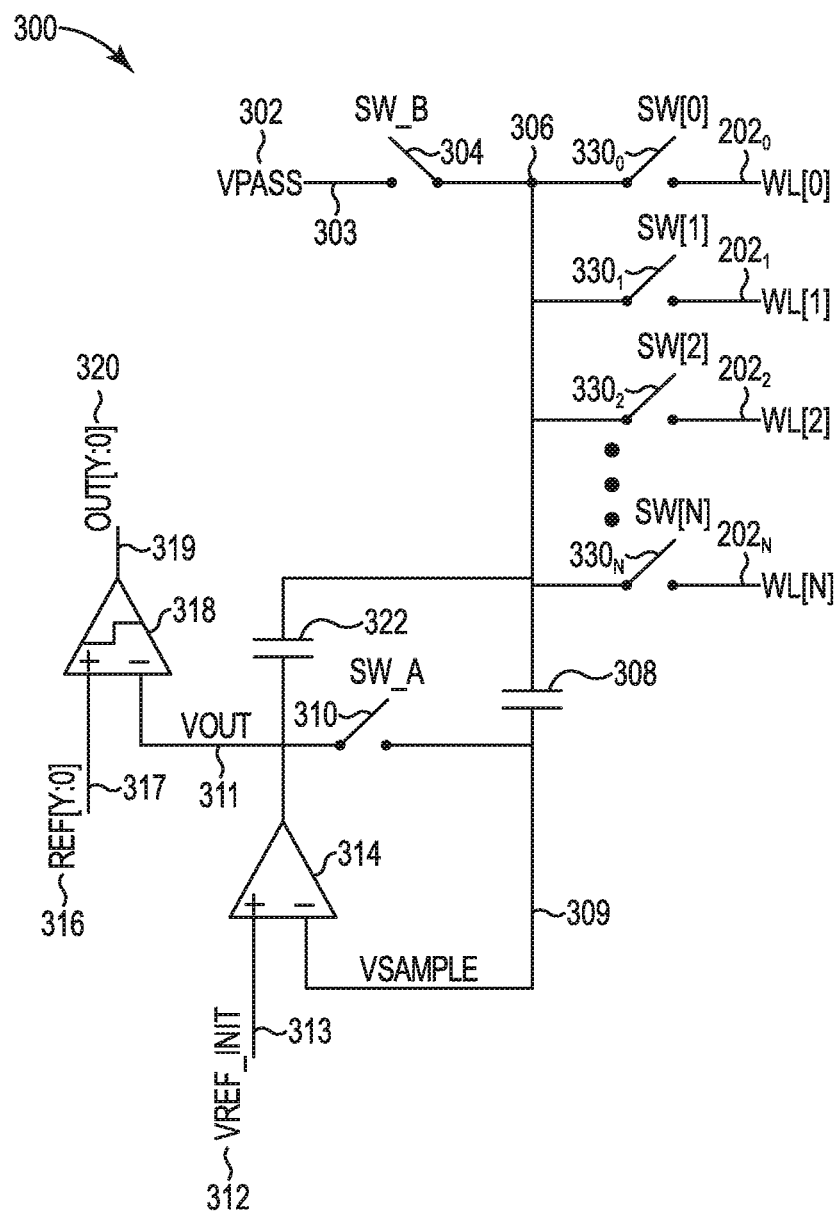
FIG. 4 is a schematic diagram illustrating one embodiment of a system including the leakage current detection circuit described with reference to FIG. 3.

FIG. 4 is a schematic diagram illustrating one embodiment of a system including the leakage current detection circuit 300 described with reference to FIG. 3. In addition to leakage current detection circuit 300 previously described and illustrated with reference to FIG. 3, the system includes a plurality of access line switches (SW[0] to SW[N]) $330_0$ to $330_N$ and word lines (WL[0] to WL[N]) $202_0$ to $202_N$. One side of each switch $330_0$ to $330_N$ is electrically coupled to node 306, and the other side of each switch $330_0$ to $330_N$ is electrically coupled to a word line $202_0$ to $202_N$, respectively. With switch 304 closed, each switch $330_0$ to $330_N$ is closed to connect each word line $202_0$ to $202_N$ to reference voltage 302 to initialize each word line $202_0$ to $202_N$ to VPASS. In one example, a capacitance of each word line $202_0$ to $202_N$ is charged in response to switch 304 and switches $330_0$ to $330_N$ being closed. With switches 304 and 310 open, the leakage current, if any, of each word line $202_0$ to $202_N$ may be detected by sequentially closing and opening one switch $330_0$ to $330_N$ at a time to detect a change in VOUT for each word line.

Figure 5A:
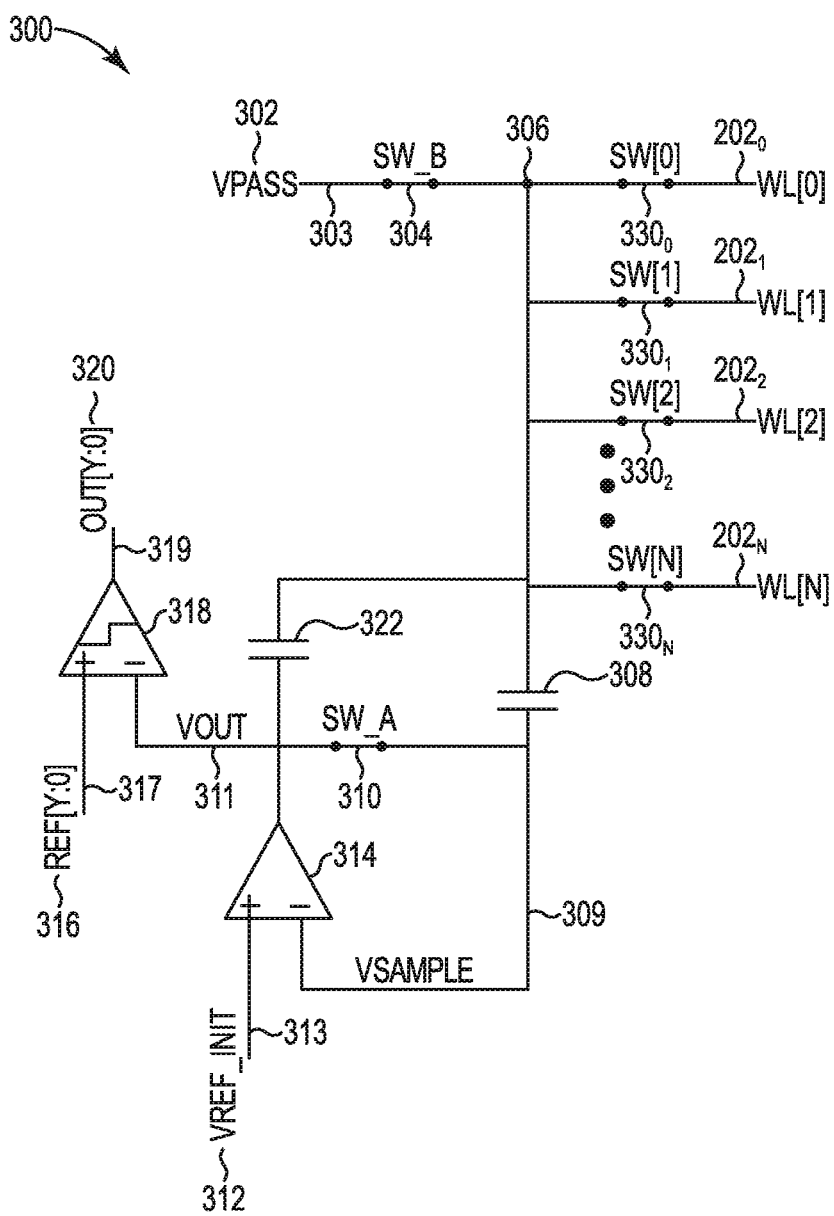
FIG. 5A is a schematic diagram illustrating one embodiment of the system described with reference to FIG. 4 during an initialization phase.

FIG. 5A is a schematic diagram illustrating one embodiment of the system described with reference to FIG. 4 during an initialization phase. As shown in FIG. 5A, during the initialization phase, switches 304 and $330_0$ to $330_N$ are closed to initialize each word line $202_0$ to $202_N$ to VPASS. Switch 310 is also closed during the initialization phase to initialize amplifier 314 in unity-gain configuration such that VSAMPLE and VOUT substantially equal VREF_INIT.

Figure 5B:
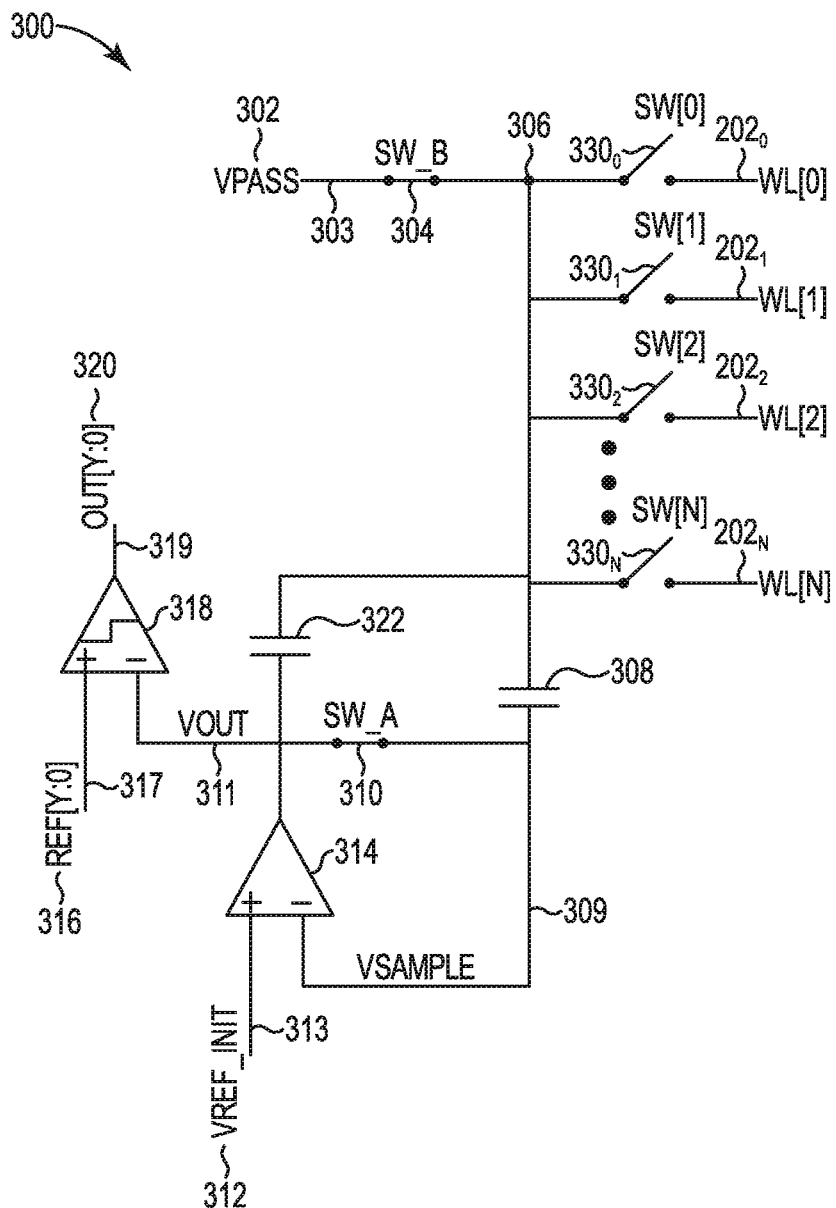
FIG. 5B is a schematic diagram illustrating one embodiment of the system described with reference to FIG. 4 during a signal development phase.

FIG. 5B is a schematic diagram illustrating one embodiment of the system described with reference to FIG. 4 during a signal development phase. As shown in FIG. 5B, during the signal development phase, switch 304 remains closed and switches $330_0$ to $330_N$ are opened to develop a signal on each word line $202_0$ to $202_N$. In response to a leakage current on a word line, the voltage of the word line will decrease during the signal development phase. If no leakage current is present on a word line, the voltage of the word line will remain substantially constant during the signal development phase due to a capacitance of the word line. Switch 310 remains closed during the signal development phase to maintain amplifier 314 at unity gain.

Figure 5C:
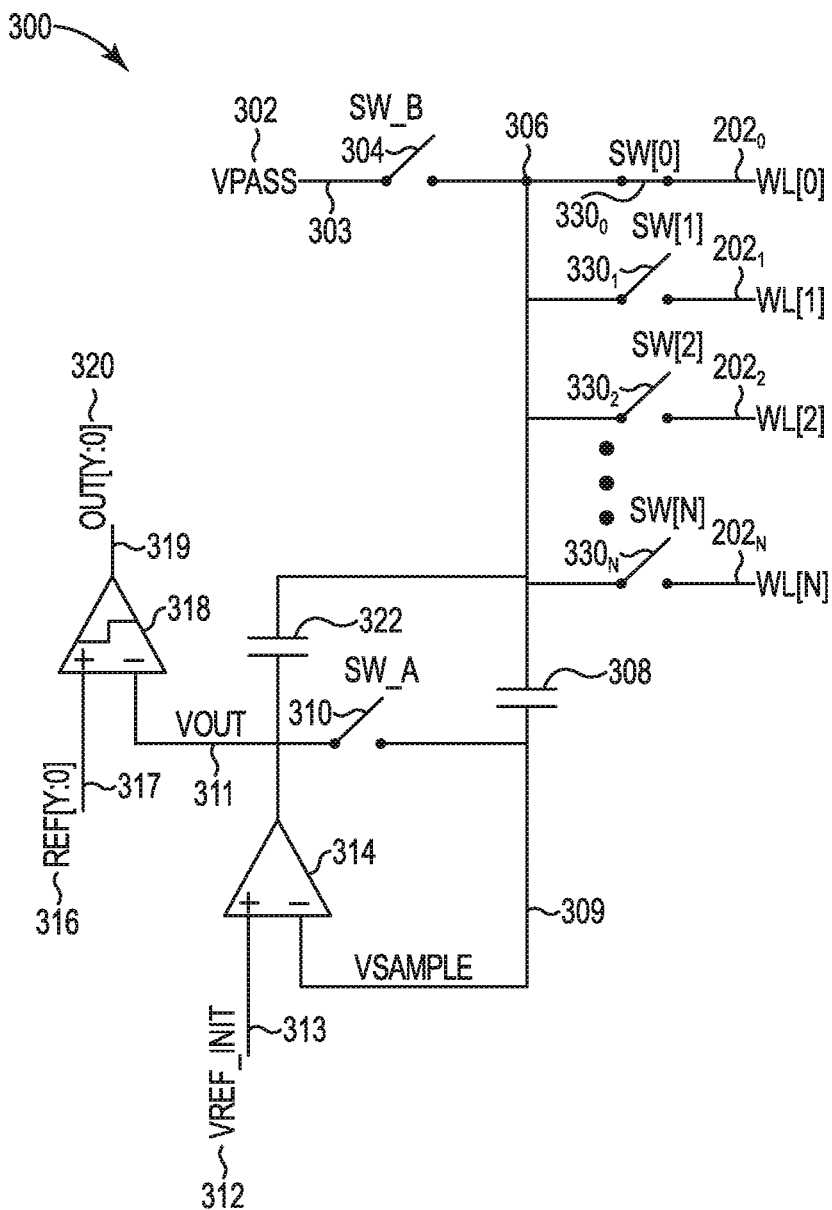
FIG. 5C is a schematic diagram illustrating one embodiment of the system described with reference to FIG. 4 during a leakage current detection phase.

FIG. 5C is a schematic diagram illustrating one embodiment of the system described with reference to FIG. 4 during a leakage current detection phase. FIG. 5C illustrates detecting the leakage current of word line $202_0$. As shown in FIG. 5C, during the leakage current detection phase, switches 304 and 310 are opened to reconfigure amplifier 314 to detect leakage current. A selected word line switch (i.e., $330_0$ in this example) is closed while the remaining word line switches $330_0$ to $330_N$ (i.e., $330_1$ to $330_N$ in this example) remain open. With the selected word line switch closed, the selected word line is capacitively coupled to amplifier 314 via capacitors 308 and 322. In response to the voltage of the selected word line decreasing during the signal development phase indicating a leakage current on the selected word line, amplifier 314 will increase VOUT to compensate for the decrease in VSAMPLE. In response to the voltage of the selected word line remaining substantially constant during the signal development phase indicating no leakage current on the selected word line, amplifier 314 will maintain VOUT at substantially VREF_INIT since VSAMPLE remains substantially constant.

The leakage current of a selected word line is linearly proportional to the change in VOUT as given by the following:

$$I_{WL} = \frac{\Delta V_{out} C_{sample}}{T_{dev}}$$

where: $I_{WL}$ is the leakage current of the selected word line; $\Delta V_{out}$ is the change in VOUT; $C_{sample}$ is the capacitance of capacitor 322; and $T_{dev}$ is the development time of the signal development phase.

For example, for a 1 pF capacitor 322 and a 1 μs development time, a change in VOUT of 1V results in detecting a 1 μA leakage current as follows:

$$I_{WL} = \frac{\Delta V_{out} C_{sample}}{T_{dev}} = \frac{(1 \text{ V})(1 \text{ pF})}{1 \text{ μs}} = 1 \text{ μA}$$

In another example, for a 1 pF capacitor 322 and a 10 μs development time, a change in VOUT of 1V results in detecting a 100 nA leakage current as follows:

$$I_{WL} = \frac{\Delta V_{out} C_{sample}}{T_{dev}} = \frac{(1 \text{ V})(1 \text{ pF})}{10 \text{ μs}} = 100 \text{ nA}$$

In another example, for a 1 pF capacitor 322 and a 10 μs development time, a change in VOUT of 0.1V results in detecting a 10 nA leakage current as follows:

$$I_{WL} = \frac{\Delta V_{out} C_{sample}}{T_{dev}} = \frac{(0.1 \text{ V})(1 \text{ pF})}{10 \text{ μs}} = 10 \text{ nA}$$

Figure 6:
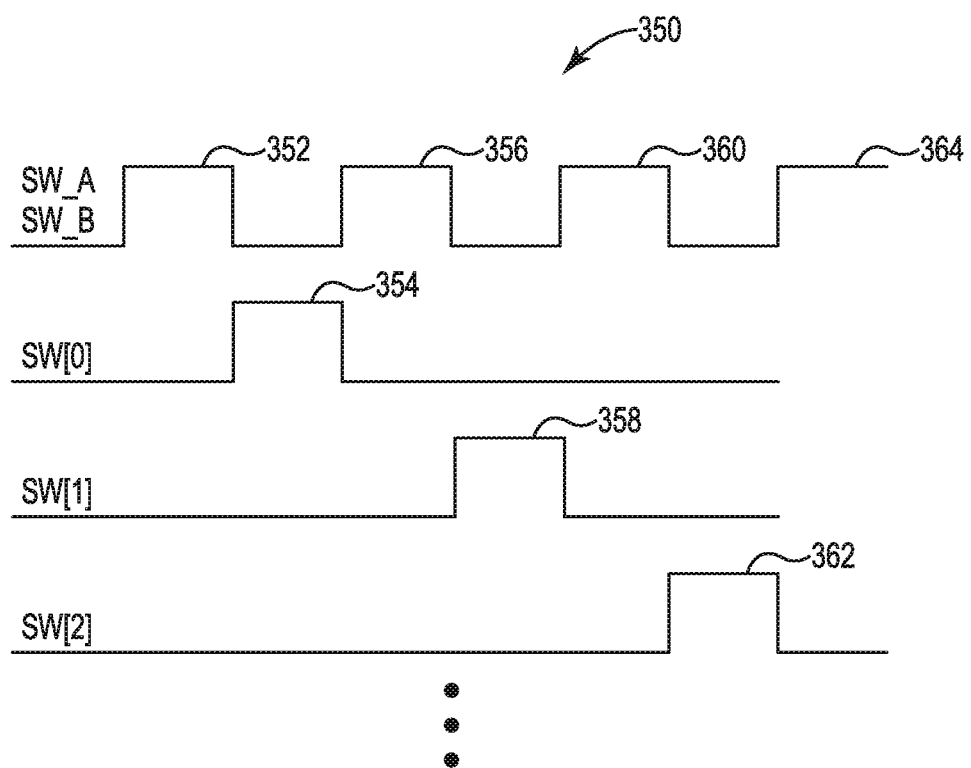
FIG. 6 is a timing diagram illustrating one embodiment of control signals for the leakage current detection phase of the system described with reference to FIG. 4.

FIG. 6 is a timing diagram 350 illustrating one embodiment of control signals for the leakage current detection phase of the system described with reference to FIG. 4. Prior to the leakage current detection phase shown in FIG. 6, switches 304, 310, and $330_0$ to $330_N$ are closed during an initialization phase to initialize each word line $202_0$ to $202_N$ to VPASS and to initialize amplifier 314 in unity-gain configuration. Switches $330_0$ to $330_N$ are then opened during a development phase to develop a signal on each word line $202_0$ to $202_N$. During the development phase, switches 304 and 310 may remain closed as indicated at 352 in timing diagram 350. Once the development phase is complete, switches 304 and 310 are opened and the leakage current detection phase begins.

As indicated at 354, switch $330_0$ is closed to detect the leakage current of word line $202_0$. In one example, switch $330_0$ is closed for 1 μs or another suitable time. If there is a leakage current on word line $202_0$, the voltage on node 306 and VSAMPLE will decrease, which will cause VOUT to increase. If there is no leakage current on word line $202_0$, the voltage on node 306 and VSAMPLE will remain substantially constant such that VOUT will remain substantially constant. After a sampling time (e.g., less than 1 μs such as 0.5 μs) from the closing of switch $330_0$, the digital value of VOUT provided by ADC 318 is sampled by a controller or other suitable logic circuitry to determine the leakage current, if any, of word line $202_0$.

After detecting the leakage current, if any, of word line $202_0$, switch $330_0$ is opened and switches 304 and 310 are again closed as indicated at 356 to reinitialize node 306 to VPASS and to reinitialize amplifier 314 in unity-gain configuration. After a reinitialization time (e.g., 1 µs), switches 304 and 310 are opened and switch $330_1$ is closed as indicated at 358 to detect the leakage current of word line $202_1$. After detecting the leakage current, if any, of word line $202_1$, switch $330_1$ is opened and switches 304 and 310 are again closed as indicated at 360 to reinitialize node 306 to VPASS and to reinitialize amplifier 314 in unity-gain configuration. Switches 304 and 310 are then opened and switch $330_2$ is closed as indicated at 362 to detect the leakage current of word line $202_2$. After detecting the leakage current, if any, of word line $202_2$, switch $330_2$ is opened and switches 304 and 310 are again closed as indicated at 364 to reinitialize node 306 to VPASS and to reinitialize amplifier 314 in unity-gain configuration. The process then repeats for each remaining word line $202_3$ to $202_N$ until the leakage current, if any, of each word line $202_0$ to $202_N$ has been detected. In other examples, the reinitialization of node 306 to VPASS and the reinitialization of amplifier 314 in unity-gain configuration as indicated at 356, 360, and 364 may be excluded.

Figure 7:
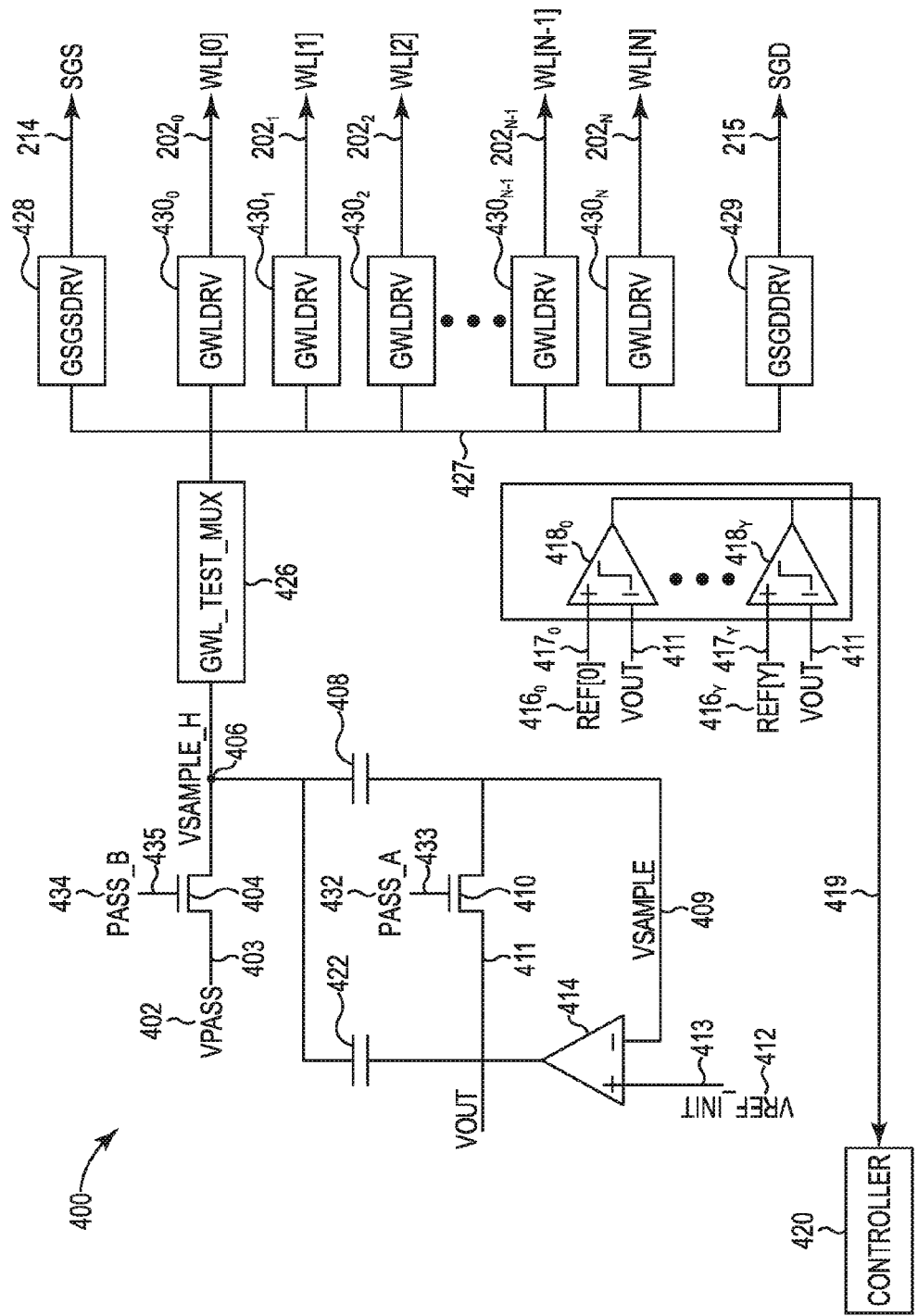
FIG. 7 is a schematic diagram illustrating another embodiment of a system including a leakage current detection circuit to detect word line leakage current, source select line leakage current, and drain select line leakage current.

FIG. 7 is a schematic diagram illustrating another embodiment of a system including a leakage current detection circuit 400 to detect word line leakage current, source select line leakage current, and drain select line leakage current. Leakage current detection circuit 400 includes a first transistor switch 404, a second transistor switch 410, a first capacitor 422 (e.g., 1 pF), a second capacitor 408 (e.g., 1 pf), an amplifier 414 (e.g., an operational amplifier), a plurality of comparators $418_0$ to $418_Y$ (e.g., ADC 318 of FIGS. 5A-5C), a controller 420, a global word line test multiplexer (GWL_TEST_MUX) 426, a global source select line driver (GSGSDRV) 428, a global drain select line driver (GSGD-DRV) 429, and global word line drivers (GWLDRV) $430_0$ to $430_N$. While nMOS type transistor switches 404 and 410 are illustrated in FIG. 7, in other examples transistor switches 404 and 410 may be pMOS or cMOS type transistor switches or other suitable switches.

One side of the source/drain path of transistor switch 404 is electrically coupled to a first reference voltage (VPASS) 402 (e.g., 15V) through a node 403. The gate of transistor switch 404 receives a control signal (PASS_B) 434 through a signal path 435. The other side of the source/drain path of transistor switch 404 is electrically coupled to node 406 through a high sample voltage (VSAMPLE_H) signal path. Node 406 is electrically coupled to one side of global word line test multiplexer 426, one side of capacitor 408, and one side of capacitor 422. The other side of capacitor 408 is electrically coupled to one side of the source/drain path of transistor switch 410 and the inverting input of amplifier 414 through a sample voltage (VSAMPLE) signal path 409. The other side of capacitor 422 is electrically coupled to the other side of the source/drain path of transistor switch 410, the output of amplifier 414, and the inverting input of each comparator $418_0$ to $418_Y$ through an output voltage (VOUT) signal path 411. The gate of transistor switch 410 receives a control signal (PASS_A) 432 through a signal path 433. The non-inverting input of amplifier 414 is electrically coupled to a second reference voltage (VREF_INIT) 412 (e.g., 1V) through a signal path 413. The non-inverting input of each comparator $418_0$ to $418_Y$ is electrically coupled to a reference voltage (REF[0] to REF[Y]) $416_0$ to $416_Y$ (e.g., 0.9V to 1.1V with 0.01V step) through a signal path $417_0$ to $417_Y$, respectively. The output of each comparator $418_0$ to $418_Y$ is electrically coupled to controller 420 through a signal path 419. Controller 420 may be within the memory device or within a testing device external to the memory device.

The other side of global word line test multiplexer 426 is electrically coupled to one side of global source select line driver 428, one side of global drain select line driver 429, and one side of each global word line driver $430_0$ to $430_N$ through a signal path 427. The other side of global source select line driver 428 is electrically coupled to source select line 214. The other side of global drain select line driver 429 is electrically coupled to drain select line 215. The other side of each global word line driver $430_0$ to $430_N$ is electrically coupled to a word line $202_0$ to $202_N$, respectively. Global word line test multiplexer 426 includes circuitry to selectively electrically couple source select line 214, drain select line 215, and each word line $202_0$ to $202_N$ to node 406 via global source select line driver 428, global drain select line driver 429, and each global word line driver $430_0$ to $430_N$, respectively.

With transistor switch 404 closed (i.e., conducting), reference voltage 402 is connected to node 406 to initialize the voltage on node 406 to VPASS. With transistor switch 404 closed, global word line test multiplexer 426 connects source select line 214, drain select line 215, and each word line $202_0$ to $202_N$ to node 406 via global source select line driver 428, global drain select line driver 429, and each global word line driver $430_0$ to $430_N$ to initialize source select line 214, drain select line 215, and each word line $202_0$ to $202_N$ to VPASS, respectively. Transistor switch 410 is closed (i.e., conducting) to initialize amplifier 414 in unity-gain configuration such that VSAMPLE and VOUT substantially equal VREF_INIT. With transistor switches 404 and 410 open (i.e., not conducting), the leakage current of source select line 214, drain select line 215, and each word line $202_0$ to $202_N$ may be detected by sequentially connecting source select line 214, drain select line 215, and each word line $202_0$ to $202_N$ to node 406 via global word line test multiplexer 426, global source select line driver 428, global drain select line driver 429, and each global word line driver $430_0$ to $430_N$, respectively, to detect a change in VOUT. The change in VOUT is detected by comparators $418_0$ to $418_Y$, which compare VOUT to each reference voltage $416_0$ to $416_Y$ to convert VOUT to a digital value, which may be latched by controller 420.

Figure 8:
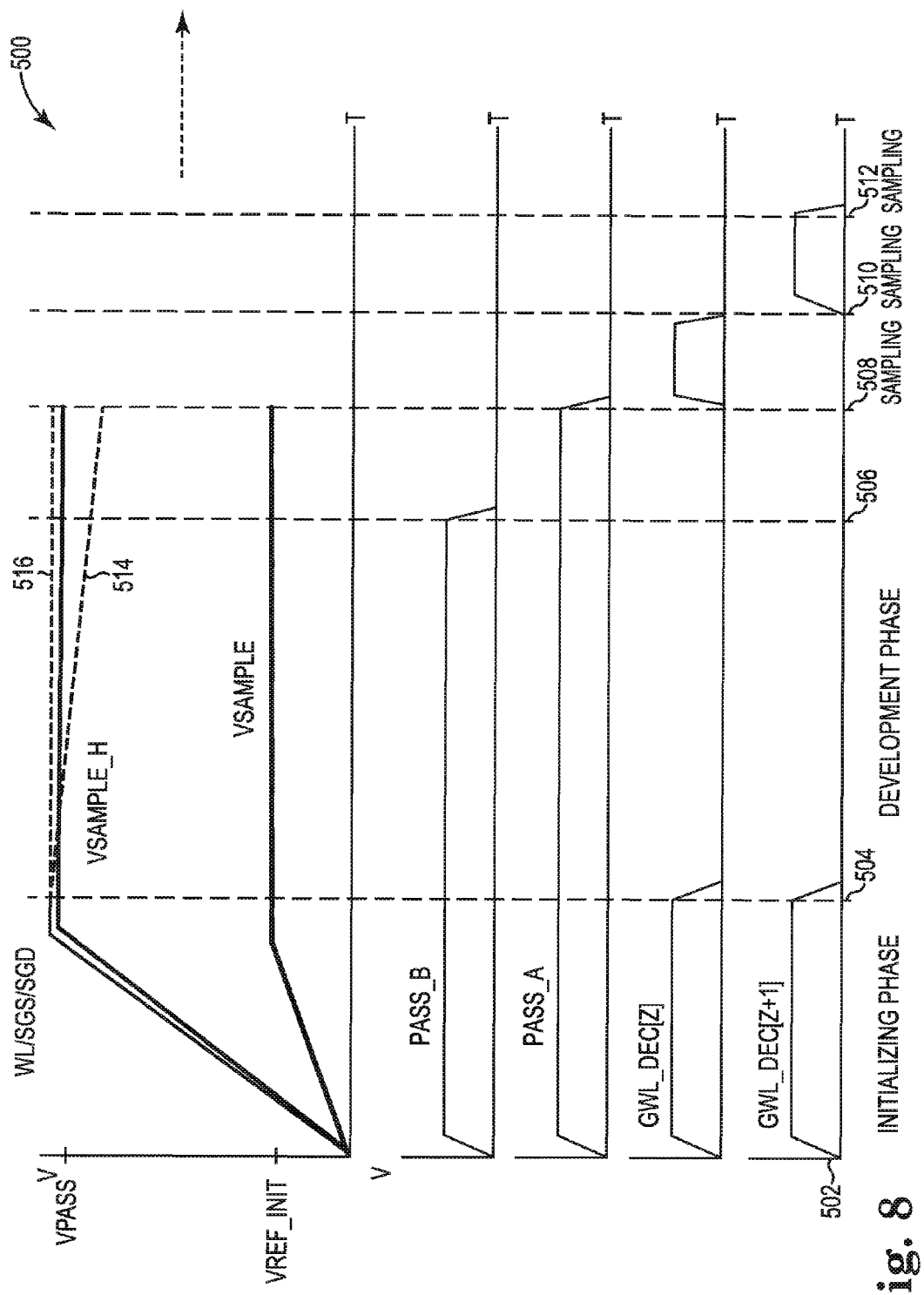
FIG. 8 is a timing diagram illustrating one embodiment of control signals and leakage current detection circuit signals during the operation of the leakage current detection circuit described with reference to FIG. 7.

FIG. 8 is a timing diagram 500 illustrating one embodiment of control signals and leakage current detection circuit signals during the operation of leakage current detection circuit 400 described with reference to FIG. 7. In one example, the control signals are provided by controller 420. During an initializing phase between times 502 and 504 (e.g., 5 µs), transistor switches 404 and 410 are closed by setting the PASS_B and PASS_A signals to a logic high, respectively. Also during the initializing phase, global word line test multiplexer 426, global source select line driver 428, global drain select line driver 429, and each global word line driver $430_0$ to $430_N$ are configured by setting global word line decoder (GWL_DEC) signals, indicated for example by GWL_DEC[z] and GWL_DEC[z+1], to a logic high. In response to the control signals during the initializing phase, source select line 214, drain select line 215, and each word line $202_0$ to $202_N$ is initialized to VPASS and amplifier 414 is initialized in unity-gain configuration. After the initializing phase at 504, VSAMPLE_H on node 406 and the voltage on source select line 214, drain select line 215, and each word line $202_0$ to $202_N$ substantially equals VPASS. Also after the initializing phase at 504, VSAMPLE substantially equals VREF_INIT.

During a development phase between times 504 and 508 (e.g., 5 µs), the global word line decoder signals are set to a logic low and global word line test multiplexer 426, global source select line driver 428, global drain select line driver 429, and each global word line driver $430_0$ to $430_N$ are configured to disconnect source select line 214, drain select line 215, and each word line $202_0$ to $202_N$ from node 406 to develop a signal on source select line 214, drain select line 215, and each word line $202_0$ to $202_N$. During the development phase, transistor switches 404 and 410 may remain closed. During the development phase, if there is a leakage current on a source select line 214, drain select line 215, or word line $202_0$ to $202_N$, the voltage on the respective source select line 214, drain select line 215, or word line $202_0$ to $202_N$ will decrease as indicated at 514. If there is substantially no leakage current on a source select line 214, drain select line 215, or word line $202_0$ to $202_N$, the voltage on the respective source select line 214, drain select line 215, or word line $202_0$ to $202_N$ will remain substantially constant as indicated at 516. VSAMPLE_H and VSAMPLE remain substantially constant during the development phase. Transistor switch 404 may be opened at time 506 prior to the opening of transistor switch 410 at time 508. In one example, transistor switch 404 may be opened 1 µs prior to the opening of transistor switch 410.

Once the development phase is complete, transistor switches 404 and 410 are opened and the leakage current detection phase begins. During a sampling phase between times 508 and 510, global word line test multiplexer 426, global source select line driver 428, global drain select line driver 429, and global word line drivers $430_0$ to $430_N$ are configured by setting a control signal, indicated for example by GWL_DEC[z], to a logic high to connect a selected source select line, drain select line, or word line to node 406 to detect the leakage current of the selected source select line, drain select line, or word line.

Figure 9A:
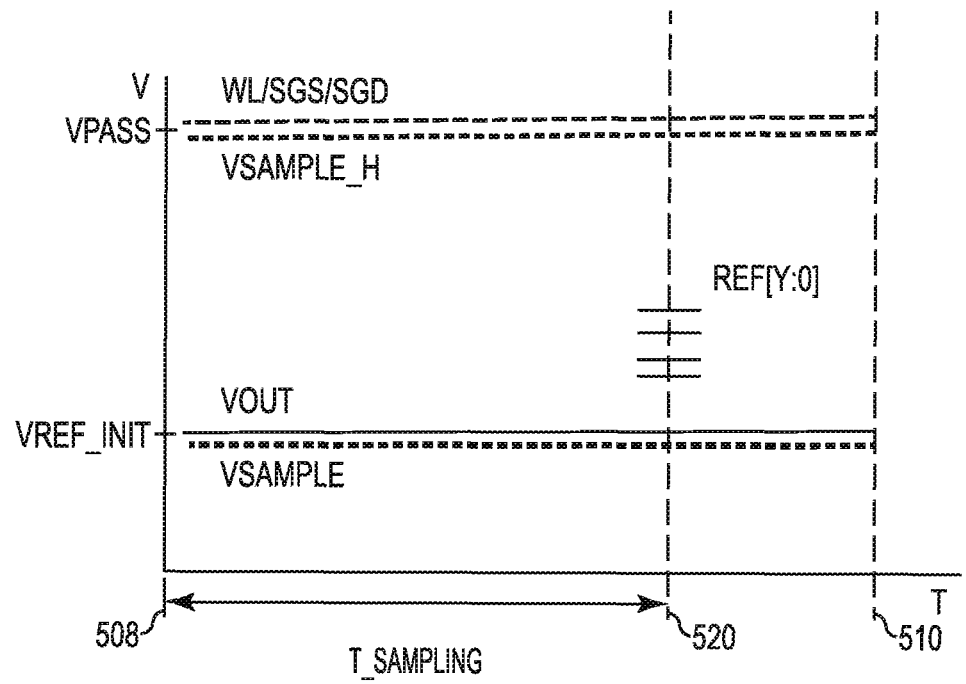
FIG. 9A is a timing diagram illustrating one embodiment of leakage current detection circuit signals during a sampling phase of the leakage current detection circuit described with reference to FIG. 7.

FIG. 9A is a timing diagram illustrating one embodiment of leakage current detection circuit signals during a sampling phase (i.e., a leakage current detection phase) between times 508 and 510 of the leakage current detection circuit described with reference to FIG. 7. If there is no leakage current on the selected source select line, drain select line, or word line, VSAMPLE_H, VSAMPLE, and VOUT will remain substantially constant as shown in FIG. 9A. After a sampling time (T_SAMPLING) from time 508 to time 520 (e.g., 0.5 µs), VOUT is compared to each reference voltage REF[Y:0]. In this example, since VOUT does not change, no leakage current is detected on the selected source select line, drain select line, or word line.

Figure 9B:
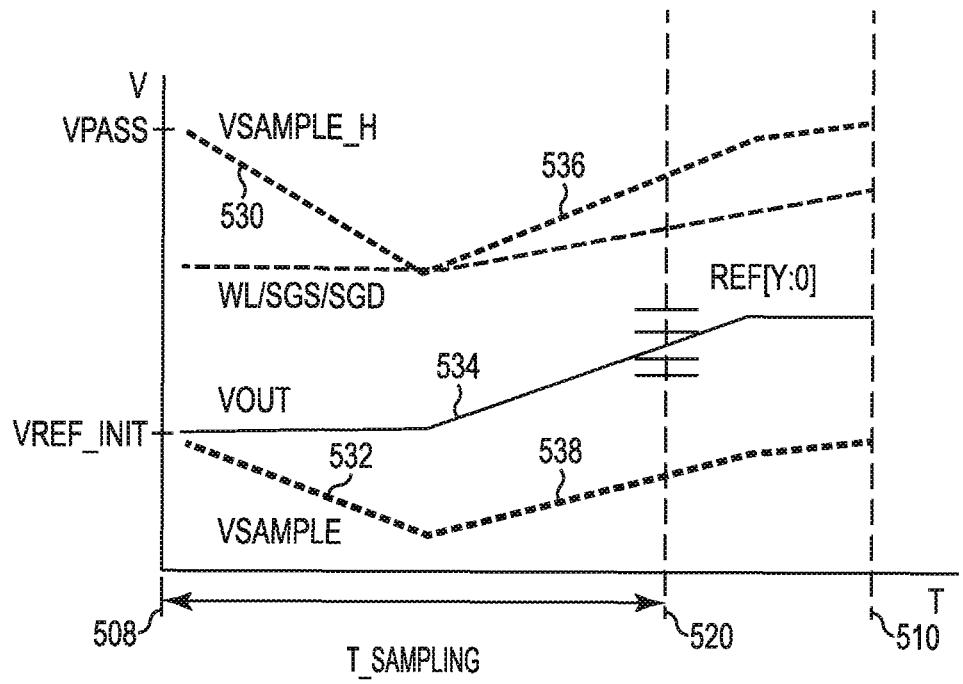
FIG. 9B is a timing diagram illustrating another embodiment of leakage current detection circuit signals during a sampling phase of the leakage current detection circuit described with reference to FIG. 7.

FIG. 9B is a timing diagram illustrating another embodiment of leakage current detection circuit signals during a sampling phase between times 508 and 510 of the leakage current detection circuit described with reference to FIG. 7. If there is a leakage current on the selected source select line, drain select line, or word line, VSAMPLE_H and VSAMPLE will decrease as indicated at 530 and 532, respectively. In response to the decrease in VSAMPLE, VOUT increases as indicated at 534, which causes VSAMPLE_H and VSAMPLE to rise as indicated at 536 and 538, respectively. After a sampling time (T_SAMPLING) from time 508 to time 520 (e.g., 0.5 µs), VOUT is compared to each reference voltage REF[Y:0]. In this example, since VOUT changed, a leakage current is detected on the selected source select line, drain select line, or word line.

Returning to FIG. 8, the process is repeated for each source select line, drain select line, and word line as indicated for example during another sampling phase between times 510 and 512 to detect a change in VOUT for each source select line, drain select line, and word line. Based on the leakage current, it may be determined whether a source select line, drain select line, or word line has a defect.

Figure 10:
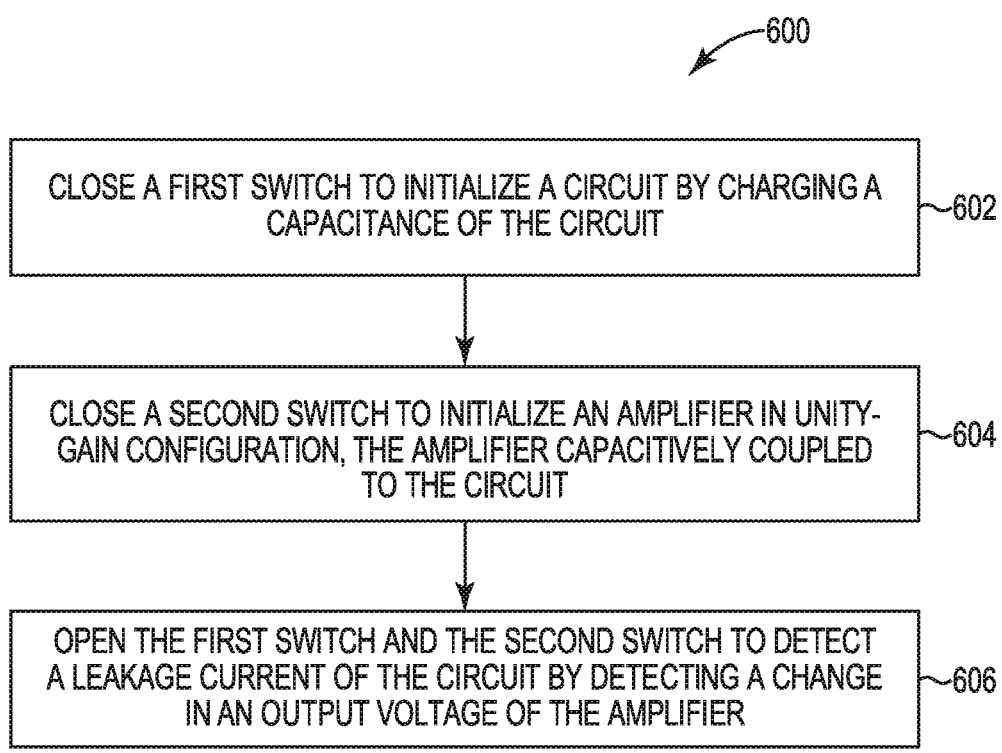
FIG. 10 is a flow diagram illustrating one embodiment of a method for detecting leakage current.

FIG. 10 is a flow diagram illustrating one embodiment of a method 600 for detecting leakage current. At 602, a first switch is closed to initialize a circuit by charging a capacitance of the circuit. At 604, a second switch is closed to initialize an amplifier in unity-gain configuration, where the amplifier is capacitively coupled to the circuit. At 606, the first switch and the second switch are opened to detect a leakage current of the circuit by detecting a change in an output voltage of the amplifier. In one example, method 600 further includes closing a third switch between the first switch and the circuit to initialize the circuit, and opening the third switch prior to opening the first switch and the second switch. Closing the first switch may electrically couple a reference voltage to the circuit. Closing the second switch may initialize the output voltage of the amplifier to a reference voltage. Method 600 may further include detecting a change in the output voltage by converting the output voltage to a digital value and sampling the digital value in response to a sampling time elapsing from the opening of the first switch and the second switch. The sampling of the digital value may be performed within the memory device or by a testing device external to the memory device.

Figure 11:
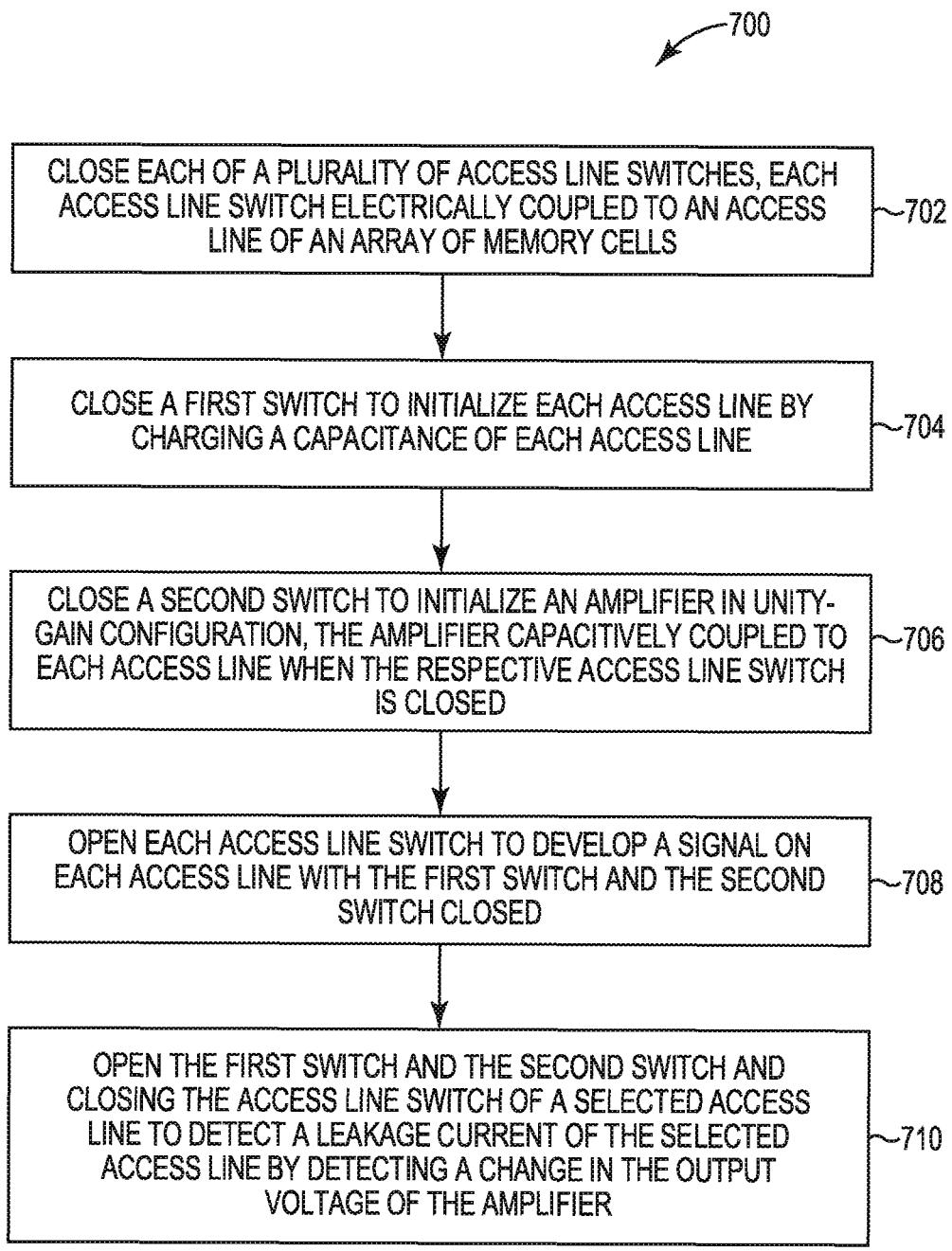
FIG. 11 is a flow diagram illustrating another embodiment of a method for detecting leakage current.

FIG. 11 is a flow diagram illustrating another embodiment of a method 700 for detecting leakage current. At 702, each of a plurality of access line switches is closed (e.g., $330_0$ to $330_N$ of FIG. 5A), where each access line switch is electrically coupled to an access line (e.g., word lines $202_0$ to $202_N$ of FIG. 5A) of an array of memory cells. At 704, a first switch is closed to initialize each access line by charging a capacitance of each access line. At 706, a second switch is closed to initialize an amplifier in unity-gain configuration, where the amplifier is capacitively coupled to each access line when the respective access line switch is closed. At 708, each access line switch is opened to develop a signal on each access line with the first switch and the second switch closed. At 710, the first switch and the second switch are opened and the access line switch of a selected access line is closed to detect a leakage current of the selected access line by detecting a change in the output voltage of the amplifier.

Detecting the change in the output voltage of the amplifier may include converting the output voltage to a digital value and sampling the digital value in response to a sampling time elapsing from the closing of the access line switch of the selected access line. In one example, method 700 may further include opening the access line switch of the selected access line and closing the access line switch of a further selected access line to detect a leakage current of the further selected access line by detecting a change in the output voltage of the amplifier. In another example, method 700 may further include opening the access line switch of the selected access line, closing the first switch and the second switch to initialize the amplifier in unity-gain configuration, and opening the first switch and the second switch and closing the access line switch of a further selected access line to detect a leakage current of the further selected access line by detecting a change in the output voltage of the amplifier. Detecting the leakage current of the selected access line may include detecting an increase in the output voltage proportional to the leakage current. Closing the second switch may initialize the output voltage of the amplifier to a reference voltage.

Figure 12:
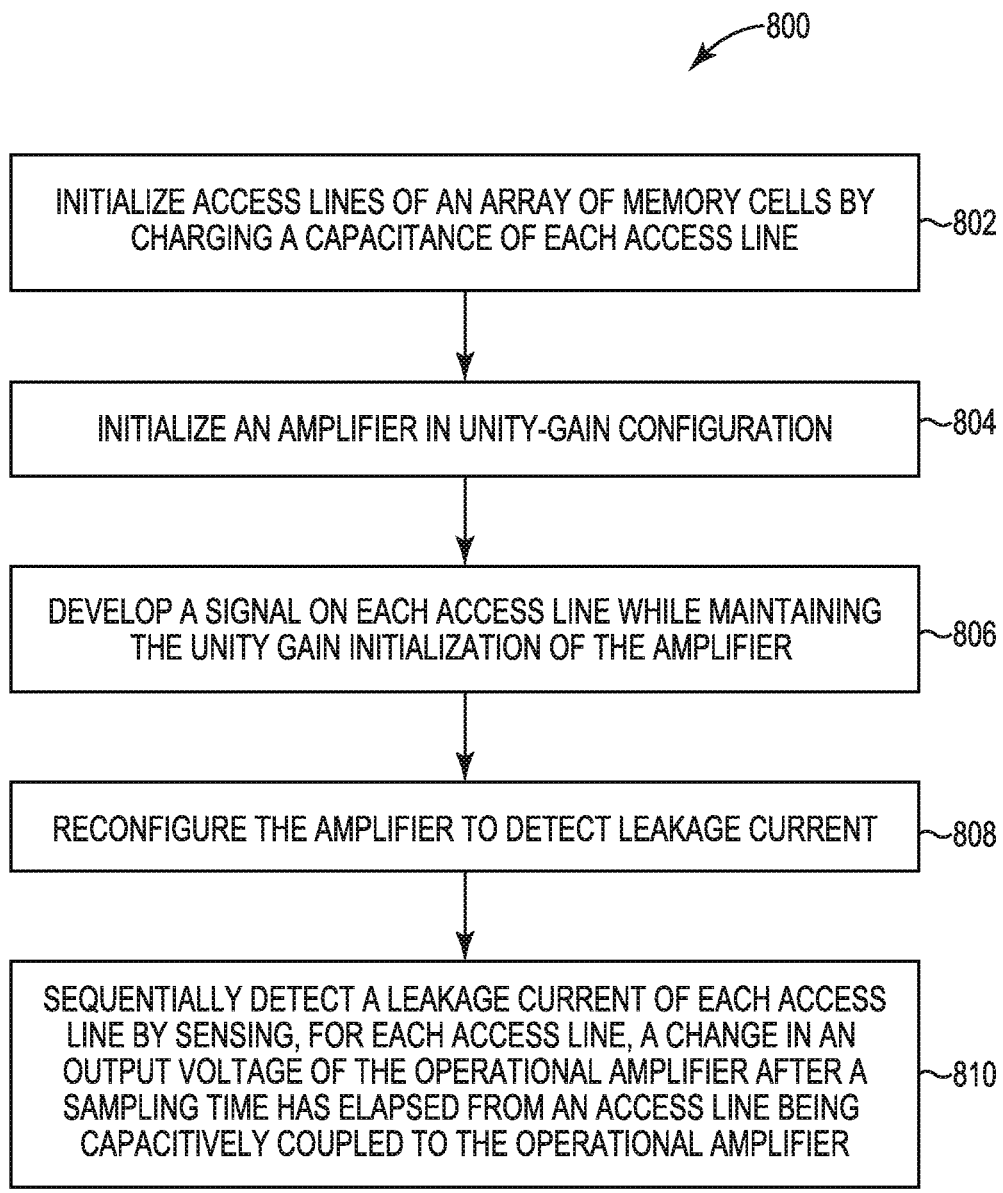
FIG. 12 is a flow diagram illustrating another embodiment of a method for detecting leakage current.

FIG. 12 is a flow diagram illustrating another embodiment of a method 800 for detecting leakage current. At 802, access lines of an array of memory cells are initialized by charging a capacitance of each access line. At 804, an amplifier (e.g., an operational amplifier) is initialized in unity-gain configuration. At 806, a signal is developed on each access line while maintaining the unity gain initialization of the amplifier. At 808, the amplifier is reconfigured to detect leakage current. At 810, a leakage current of each access line is sequentially detected by sensing, for each access line, a change in an output voltage of the amplifier after a sampling time has elapsed from an access line being capacitively coupled to the amplifier.

In one example, method 800 further includes initializing select lines of the array of memory cells by charging a capacitance of each select line, developing a signal on each select line while maintaining the unity gain initialization of the amplifier, and with the amplifier reconfigured to detect leakage current, sequentially detecting a leakage current of each select line by sensing, for each select line, a change in the output voltage of the amplifier after the sampling time has elapsed from a select line being capacitively coupled to the amplifier. Initializing the access lines may include applying a first reference voltage to the access lines, and initializing the amplifier in unity-gain configuration may include initializing the output voltage of the amplifier to a second reference voltage less than the first reference voltage. Sensing the change in the output voltage of the amplifier may include converting the output voltage to a digital value and sampling the digital value in response to the sampling time elapsing.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A system comprising:
an amplifier having a first input, a second input, and an output, the amplifier to receive a first reference voltage on the first input and a sample voltage on the second input to provide an output voltage on the output based on the first reference voltage and the sample voltage;
a first switch electrically coupled between a first node configured to receive a second reference voltage and a second node;
a second switch electrically coupled between the output of the amplifier and the second input of the amplifier;
a first capacitor directly electrically coupled between the output of the amplifier and the second node;
a second capacitor electrically coupled between the second input of the amplifier and the second node; and
a controller to control the first switch and the second switch.

2. The system of claim 1, wherein the first switch and the second switch are closed to initialize the second node to the second reference voltage and to initialize the amplifier in unity-gain configuration, and
wherein the first switch and the second switch are opened to detect a leakage current by sensing a change in the output voltage of the amplifier.

3. The system of claim 1, further comprising:
an analog-to-digital converter to convert the output voltage of the amplifier to a digital value.

4. The system of claim 3,
wherein the controller is to receive the digital value of the output voltage.

5. The system of claim 1, wherein the second reference voltage is greater than the first reference voltage.

6. The system of claim 1, wherein the first switch is closed to initialize a circuit electrically coupled to the second node by charging a capacitance of the circuit.

7. A method comprising:
closing a first switch to initialize a circuit by charging a capacitance of the circuit;
closing a second switch to initialize an amplifier in unity-gain configuration, the amplifier capacitively coupled to the circuit; and
opening the first switch and the second switch to detect a leakage current of the circuit by detecting a change in an output voltage of the amplifier.

8. The method of claim 7, further comprising:
closing a third switch between the first switch and the circuit to initialize the circuit; and
opening the third switch prior to opening the first switch and the second switch.

9. The method of claim 7, wherein closing the first switch electrically couples a reference voltage to the circuit.

10. The method of claim 7, wherein closing the second switch initializes the output voltage of the amplifier to a reference voltage.

11. The method of claim 7, further comprising:
detecting a change in the output voltage by converting the output voltage to a digital value and sampling the digital value in response to a sampling time elapsing from the opening of the first switch and the second switch.

12. A system comprising:
an array of memory cells comprising a plurality of access lines;
a plurality of access line switches, each access line switch to individually select an access line;
an amplifier having a first input, a second input, and an output, the amplifier to receive a first reference voltage on the first input and an sample voltage on the second input to provide an output voltage on the output based on the first reference voltage and the sample voltage;
a first switch electrically coupled between a node configured to receive a second reference voltage and each of the access line switches;
a second switch electrically coupled between the output of the amplifier and the second input of the amplifier;
a first capacitor electrically coupled between the output of the amplifier and each access line switch;
a second capacitor electrically coupled between the second input of the amplifier and each access line switch; and
a controller to control the first switch, the second switch, and each access line switch,
wherein the first switch, the second switch, and each access line switch is closed to initialize the access lines to the second reference voltage and to initialize the amplifier in unity-gain configuration,
wherein the first switch and the second switch remain closed and each access line switch is opened to develop a signal on each access line, and
wherein the first switch and the second switch are opened and the access line switches are closed and opened sequentially to detect a leakage current of each access line by sensing a change in the output voltage of the amplifier while each access line switch is closed.

13. The system of claim 12, further comprising:
an analog-to-digital converter to convert the output voltage of the amplifier to a digital value.

14. The system of claim 13,
wherein the controller is to receive the digital value of the output voltage.

15. The system of claim 12, wherein the second reference voltage is greater than the first reference voltage.

16. The system of claim 12, wherein the first switch is closed and each access line switch is closed to charge a capacitance of each access line.

17. A method comprising:
closing each of a plurality of access line switches, each access line switch electrically coupled to an access line of an array of memory cells;
closing a first switch to initialize each access line by charging a capacitance of each access line;
closing a second switch to initialize an amplifier in unity-gain configuration, the amplifier capacitively coupled to each access line when a respective access line switch is closed;
opening each access line switch to develop a signal on each access line with the first switch and the second switch closed; and
opening the first switch and the second switch and closing the access line switch of a selected access line to detect a leakage current of the selected access line by detecting a change in the output voltage of the amplifier.

18. The method of claim 17, wherein detecting the change in the output voltage of the amplifier comprises converting the output voltage to a digital value and sampling the digital value in response to a sampling time elapsing from the closing of the access line switch of the selected access line.

19. The method of claim 17, further comprising:
opening the access line switch of the selected access line; and
closing the access line switch of a further selected access line to detect a leakage current of the further selected access line by detecting a change in the output voltage of the amplifier.

20. The method of claim 17, further comprising:
opening the access line switch of the selected access line;
closing the first switch and the second switch to initialize the amplifier in unity-gain configuration; and
opening the first switch and the second switch and closing the access line switch of a further selected access line to detect a leakage current of the further selected access line by detecting a change in the output voltage of the amplifier.

21. The method of claim 17, wherein detecting the leakage current of the selected access line comprises detecting an increase in the output voltage proportional to the leakage current.

22. The method of claim 17, wherein closing the second switch initializes the output voltage of the amplifier to a reference voltage.

23. A method comprising:
initializing access lines of an array of memory cells by charging a capacitance of each access line;
initializing an amplifier in unity-gain configuration;
developing a signal on each access line while maintaining the unity gain initialization of the amplifier;
reconfiguring the amplifier to detect leakage current; and
sequentially detecting a leakage current of each access line by sensing, for each access line, a change in an output voltage of the amplifier after a sampling time has elapsed from an access line being capacitively coupled to the amplifier.

24. The method of claim 23, further comprising:
initializing select lines of the array of memory cells by charging a capacitance of each select line;
developing a signal on each select line while maintaining the unity gain initialization of the amplifier; and
with the amplifier reconfigured to detect leakage current, sequentially detecting a leakage current of each select line by sensing, for each select line, a change in the output voltage of the amplifier after the sampling time has elapsed from a select line being capacitively coupled to the amplifier.

25. The method of claim 23, wherein initializing the access lines comprises applying a first reference voltage to the access lines, and
wherein initializing the amplifier in unity-gain configuration comprises initializing the output voltage of the amplifier to a second reference voltage less than the first reference voltage.

26. The method of claim 23, wherein sensing the change in the output voltage of the amplifier comprises converting the output voltage to a digital value and sampling the digital value in response to the sampling time elapsing.

* * * * *